(12) United States Patent
Cho et al.

(10) Patent No.: US 8,759,142 B2
(45) Date of Patent: Jun. 24, 2014

(54) METHOD FOR PRODUCING THIN-FILM LIGHT-ABSORBING LAYER AND METHOD FOR MANUFACTURING THIN-FILM SOLAR CELL INCLUDING THE SAME

(75) Inventors: So Hye Cho, Seoul (KR); Jong Ku Park, Gyeonggi-do (KR); Bong Geun Song, Seoul (KR); Kyunghoon Kim, Daejeon (KR); Hyung Ho Park, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 69 days.

(21) Appl. No.: 13/419,602

(22) Filed: Mar. 14, 2012

(65) Prior Publication Data

US 2013/0048074 A1    Feb. 28, 2013

(30) Foreign Application Priority Data

Aug. 22, 2011 (KR) .................. 10-2011-0083444

(51) Int. Cl.
*H01L 21/00* (2006.01)
(52) U.S. Cl.
USPC ...................................... 438/95; 257/E21.07

(58) Field of Classification Search
USPC ................ 438/89, 909; 257/E21.07, E21.073
See application file for complete search history.

(56) References Cited

U.S. PATENT DOCUMENTS 6,268,014 B1 * 7/2001 Eberspacher et al. .......... 427/74
7,998,789 B1 * 8/2011 Chuang ......................... 438/104

FOREIGN PATENT DOCUMENTS

| KR | 10-0922890 B1 | 10/2009 |
| KR | 10-0989077 B1 | 10/2010 |
| KR | 1020110055830 A | 5/2011 |

* cited by examiner

*Primary Examiner* — Chandra Chaudhari
(74) *Attorney, Agent, or Firm* — Ladas & Parry LLP

(57) ABSTRACT

Disclosed is a method for producing a copper indium selenium (CIS) or copper indium gallium selenium (CIGS) thin-film light-absorbing layer. The method includes forming a coating layer of CIGS slurry, removing a solvent, a dispersant and a binder from the coating layer to form a powder coat layer, pressing the powder coat layer to improve its particle packing density, and heating the powder layer to form a dense thin film. The method uses a powder process as a non-vacuum process to produce a CIS or CIGS thin film in high yield at low cost. Further disclosed is a method for manufacturing a thin-film solar cell including the production method.

13 Claims, 13 Drawing Sheets

METHOD FOR PRODUCING THIN-FILM LIGHT-ABSORBING LAYER AND METHOD FOR MANUFACTURING THIN-FILM SOLAR CELL INCLUDING THE SAME

CROSS-REFERENCE TO RELATED APPLICATIONS

This application claims priority under 35 U.S.C. §119 to Korean Patent Applications No. 10-2011-0083444 filed on Aug. 22, 2011 in the Korean Intellectual Property Office, the disclosure of which is incorporated herein by reference in its entirety.

BACKGROUND OF THE INVENTION

1. Field of the Invention

The present invention relates to a method for producing a copper indium selenium (CIS) or copper indium gallium selenium (CIGS) thin-film light-absorbing layer that can be applied to a thin-film solar cell, and a method for manufacturing a thin-film solar cell including the same.

2. Description of the Related Art

Solar cells are the devices that directly converts light energy into electrical energy. Solar cells have received the most intensive attention as potential systems for future energy production due to their ability to safely produce clean energy from the vast sunlight. Various kinds of inorganic and organic semiconductors have been applied to manufacture efficient solar cells. However, only a few solar cells using inorganic and organic semiconductors have been commercially successful to date, and typical examples thereof are silicon (Si) solar cells, copper indium selenium (CIS) solar cells and copper indium gallium selenium (CIGS) solar cells.

Silicon solar cells exhibit high photoelectric conversion efficiency but have the disadvantage of high manufacturing costs. Therefore, great effort to develop thin-film solar cells using compound semiconductors which are comparable with silicon solar cells has been made.

Among the various types of thin film solar cells under developing, typical examples are the solar cells comprised of a light-absorbing layer of Cu—In—Se (CIS) and Cu—In—Ga—Se (CIGS) systems, known as a CIS or CIGS thin film solar cells containing element groups of IB, IIIA, and VIA.

The CIS or CIGS thin-film solar cells are comprised of a thin-film light-absorbing layer of $CuIn_xGa_{1-x}Se_2$ ($0 \leq x \leq 1$), a thin-film buffer layer of CdS, and another layer of n-type compound semiconductor. Among them, a thin-film light-absorbing layer is most important because its characteristics determine the performance of CIS or CIGS solar cells. (Hereafter the thin-film solar cells or light-absorbing layers of CIS or CIGS systems are expressed simply as those of CIGS for convenience.)

A CIGS phase of thin-film light-absorbing layer has a chalcopyrite crystal structure whose band gap energy is in the range of 1.05 to 1.40 eV. Particularly, since the band gap energy of CIGS phase may be controlled by varying its chemical compositions, the photoelectric conversion of CIGS solar cells can be improved. In addition, a CIGS light-absorbing layer has high resistance under irradiation of electromagnetic waves such as X-ray and absorbs light efficiently, for example, more than 90% of incident light even with a thickness of 1 to 2 μm.

Manufacturing processes of CIGS solar cells can be classified into two groups of a vacuum process and a non-vacuum process.

In the vacuum process, elemental components of CIS or CIGS are evaporated under vacuum or at a low pressure (lower than 1 atm) and deposited on the surface of a substrate to form a CIGS light-absorbing layer (or film). Compared with non-vacuum process, the low-pressure process is much advantageous to obtain CIS or CIGS compounds with predetermined compositions in a single step. Additionally, target compositions of CIGS compounds may also be achieved through subsequent post-processing such as selenization. During vacuum processing, the elemental components can be supplied by various methods such as thermal vacuum evaporation, electron beam coating, sputtering, chemical vapor deposition (CVD), and metal-organic chemical vapor deposition (MOCVD). The band gap can be controlled in the thickness direction by the choice of processing methods. Therefore an adequate deposition processes and post-treatment can be chosen to obtain a desirable band gap profile of CIGS light-absorbing layer along the direction of thickness.

Many techniques related to low pressure processes have been reported. For example, Korean Patent No. 0933890 discloses a method for fabricating a CIGS thin film comprised of depositing copper indium (CuIn), copper gallium (CuGa) and a selenide compound on a substrate to form a precursor coat and subsequently heat-treating the precursor coat in a selenium atmosphere. Further, Korean Unexamined Patent Publication No. 2011-0055830 discloses a method for producing a thin-film light-absorbing layer of CIGS solar cells comprised of filling a CIGS powder into the evaporation pot in a furnace chamber; and directly evaporating the CIGS powder without composition change; and depositing the evaporated CIGS vapor onto the substrate to form a CIGS thin film.

Fabrication of CIGS light-absorbing layer by the low pressure or vacuum processes is beneficial to directly obtain a dense structure as well as to control composition in a continuous manner along the direction of thickness during deposition. On the other hand, it has drawbacks as follows: long processing time, high materials loss up to 20~40%, and very complicated process control due to multicomponent systems of three or four components.

A non-vacuum process is suitable for the production of a CIGS light-absorbing layer at atmospheric pressure condition. A powder process, a typical example of non-vacuum processes, adopts a sintering method as a key step to form the CIGS phase from the powder mixtures of oxides (e.g., CuO, $InO_2$, $Ga_2O_3$ and $SeO_2$) or binary compounds (e.g., CuIn, CuGa, CuSe, InGa, InSe and GaSe) or metallic elements (e.g., Cu, In, Ga, Se) as precursor materials. In the powder process, the CIGS phase is formed through reduction of oxide precursors into metallic elements or subsequent inter-element or inter-phase diffusion between the binary compound precursors during heat-treatment at high temperature simultaneously with controlled atmosphere. Prior to sintering at high temperature to fabricate a high-density light-absorbing layer, it is necessary to make a high-density powder coat on the substrate. Various powder processes can be used to form dense layers from the powder precursors, depending on both material types and particle characteristics. Typical examples are as follows: screen printing or doctor blade methods using slurries of precursor powders with a suitable liquid medium including some kinds of organic binders in order to control its viscosity and binding capacity, an electrostatic spray method for spraying electrically charged particles over the surface of a substrate, and an electrophoresis method for depositing electrically charged particles on the surface of a substrate with help of applied electric field. Besides of these methods, organometallic precursors can be coated over the substrate and then thermally dissociated to form a CIGS light-absorbing layer.

Korean Patent No. 0989077 discloses a method for producing a CIGS thin film by paste coating method, instead of conventional vacuum deposition. The use of a CIS or CIGS thin film produced by the method reduces loss of the raw materials in the manufacture of solar cells and enables manufacture of large-area solar cells on a commercial scale.

A dense CIGS light-absorbing layer free of open pores penetrating through the film is necessary to obtain high efficiency CIGS solar cells. However, it is not easy to produce a dense CIGS light-absorbing layer by a powder method from the powder precursors or a paste or an ink including the powder precursors. In order to obtain a dense film without open pores penetrating the film by a powder process, either thick powder coats or sintering at high temperature are inevitably chosen, which causes detrimental effects of high material loss or thermal damage of the substrate.

SUMMARY OF THE INVENTION

It is an object of the present invention to provide a method for producing a highly dense CIGS thin film from the CIGS powder precursors or a paste or an ink including the powder precursors by a non-vacuum process in a simple, highly reliable and economical manner.

According to the present invention, there is provided a method for producing a copper indium selenium (CIS) or copper indium gallium selenium (CIGS) thin-film light-absorbing layer, of which method includes: coating a slurry including a copper indium selenium (CIS) or copper indium gallium selenium (CIGS) powder precursors over the substrate to form a powder coat layer; heating the coating layer in an inert or reducing gas atmosphere to remove the included solvents and organic binders, followed by additional pressing the coating layer to improve particle packing density, or pressing the coating layer to improve particle packing density prior to removal of organic binder; and then densifying the powder coat layer by heat-treatment at high temperature in an inert or reducing gas atmosphere to form a dense thin film.

In the method of the present invention, the copper indium selenium (CIS) or copper indium gallium selenium (CIGS) powders for coating slurry may be selected from: single-phase powders of copper indium gallium selenium sulfur $(CuIn_{1-x}Ga_x(Se_{1-y}S_y)_2$, x, y=0~1); mixtures of elemental powders of copper, indium, gallium, selenium and sulfur; mixtures of oxide powders of copper, indium, gallium, and selenium; mixtures of binary compound powders of copper, indium, gallium and selenium; and mixtures of ionic copper, indium, gallium and selenium.

In the method of the present invention, the coating slurry may include an aqueous or alcoholic medium.

In the method of the present invention, the coating slurry may further include at least one kind of binder and/or at least one kind of dispersant.

In the method of the present invention, the powder coat layer may be formed by heat treatment at a temperature of 50 to 350° C.

In the method of the present invention, the powder coat layer may be additionally pressed compression at a pressure of 0.05 to 10 MPa.

In the method of the present invention, the thickness of the powder coat layer may be reduced by 50 to 90% of its original thickness with additional compressioning to improve the particle packing density of the powder coat layer.

In the method of the present invention, the powder coat layer may be pressed vertically by pressing a planar plate superimposed onto the powder coat layer with load or by rolling a cylindrical roll over the upper surface of powder coat layer with weight.

In the method of the present invention, the powder coat layer may be pressed with a release sheet covering the powder coat layer with a planar plate or a cylindrical roll.

In the method of the present invention, the CIGS thin film may be formed by heat treatment at a temperature of 250 to 600° C.

In the method of the present invention, the CIGS thin film may be formed in a selenium atmosphere.

In the method of the present invention, the CIGS thin film may be formed by heat treatment of the pressed powder coat layer in the furnace together with a selenium source comprised of a selenium metal powder and a ceramic powder.

In the method of the present invention, the selenium metal powder in the selenium source may be admixed by an amount of 1 to 40% by volume, based on the total volume of the mixed powder.

In the method of the present invention, each of the powder coat layers and the CIGS thin film layer may be formed in an inert gas atmosphere containing hydrogen gas.

According to the present invention, there is provided a method for manufacturing a copper indium selenium (CIS) or copper indium gallium selenium (CIGS) thin-film solar cell, the method including in sequence: forming a counter electrode layer over the surface of a substrate; coating a powder slurry including a copper indium selenium (CIS) or copper indium gallium selenium (CIGS) powder together with organic binder solution over the counter electrode layer to make a overlay coating layer; forming a powder coat layer through heating the overlay coating layer in an inert or reducing gas atmosphere to remove solvents and organic binder(s) in the coating layer, followed by pressing the powder coat layer to improve its particle packing density, followed by heat-treating the pressed coating layer in an inert or reducing gas atmosphere to make a dense CIGS layer through heating the powder coat layer at relatively high temperature in an inert or reducing gas atmosphere; forming a buffer layer on the prepared dense CIGS layer; and forming a transparent electrode layer on the buffer layer.

The methods of the present invention use a powder process of non-vacuum processes to produce a copper indium selenium (CIS) or copper indium gallium selenium (CIGS) thin-film light-absorbing layer. According to the methods of the present invention, a very dense thin film of CIS or CIGS can be produced even by the low-temperature sintering. Therefore, these thin films enable the manufacture of a thin-film solar cells of CIS or CIGS with high photoelectric conversion efficiency at reduced cost.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

The present invention will now be described with reference to the accompanying drawings.

Figure 1:
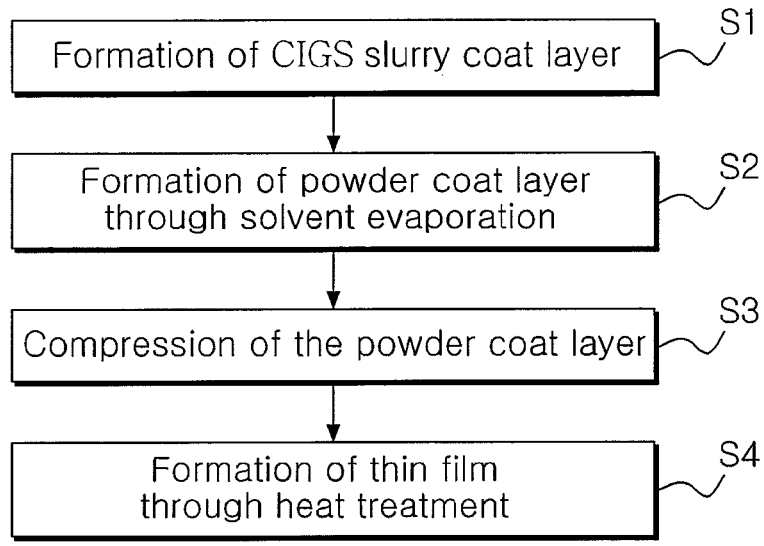
FIG. 1 is a schematic flow chart showing a method for producing a copper indium selenium (CIS) or copper indium gallium selenium (CIGS) thin-film light-absorbing layer according to the present invention.

FIG. 1 is a schematic flow chart showing a method for producing a copper indium selenium (CIS) or copper indium gallium selenium (CIGS) thin-film light-absorbing layer according to the present invention. As shown in FIG. 1, the method of the present invention includes a step for forming a slurry coat layer (S1), a step for forming a powder coat layer through solvent and binder evaporation (S2), a step for pressing either a slurry coat layer or a powder coat layer (S3) and a step for obtaining a dense thin film through heat-treatment (S4).

First, in the step S1, a coating slurry including a copper indium selenium (CIS) or copper indium gallium selenium (CIGS) powder together with organic binder dissolved in an adequate solvent is spread onto a substrate to form a slurry coat layer.

The copper indium selenium (CIS) or copper indium gallium selenium (CIGS) powder may be selected from: single-phase compound powders of copper-indium-gallium-selenium-sulfur ($CuIn_{1-x}Ga_x(Se_{1-y}S_y)_2$, x, y=0~1); powder mixtures of metallic copper, indium, gallium, and selenium and an elemental sulfur; mixtures of oxide powders of copper, indium, gallium, selenium such as $CuO$, $InO_2$, $Ga_2O_3$ and $SeO_2$ and an elemental sulfur; powder mixtures of binary compounds of copper, indium, gallium and selenium, such as $CuIn$, $CuGa$, $Cu_2Se$, $InGa$, $In_2Se_3$ and $Ga_2Se_3$; and mixtures of ionic copper, indium, gallium and selenium, such as hydroxides, nitrates, sulfates, acetates, chlorides, acetylacetonates, formic acid and $Na_2Se$. Hereinafter, these are collectively and representatively referred to as a CIGS powder.

Using a single-phase powder of CIS or CIGS as a precursor powder for a powder process advantageously provides neither need of separate reduction treatment of oxide precursor nor removal of impurities to form a CIGS single phase with high purity. On the other hand, it needs a step to densify the powder coat layer into a dense film relatively at high temperature and it is desirable to have sinterability below 900° C.

In the method of the present invention, a CIGS powder satisfying a composition of $CuIn_xGa_{1-x}Se_y$, ($0 \leq x \leq 1$, $1.8 \leq y \leq 2.5$) is used as a raw material to produce a thin-film light-absorbing layer at atmospheric pressure and a temperature of 600° C. or below. Compression and a combination of pressing and selenization are introduced in the method of the present invention to improve the packing density of the CIGS particles. These processes induce low temperature sinterability and fast densification.

The CIGS powder is homogeneously mixed with at least one solvent selected from solvents commonly used in the art, for example, aqueous solvents, alcoholic solvents, carbonate-based solvents and glycol-based solvents, to prepare a coating slurry in the form of a paste or ink. The CIGS powder is mixed in an amount of 20 to 80% by weight, based on the total weight of the coating slurry.

The coating slurry may further include at least one dispersant and/or at least one binder according to the intended purpose of use. The dispersant and binder may be those known in the related art and may be used in combination thereof. Examples of such dispersants include α-terpineol, ethylene glycol and thioacetamide, and examples of such binders include ethyl cellulose, palmitic acid, polyethylene glycol, polypropylene glycol and polypropylene carbonate. There is no limitation as to the amount of the dispersant or binder used. For example, each of the dispersant and binder may be used in an amount of about 0.01 to about 20% by weight, based on the total weight of the CIGS powder.

The coating solution may further include a sulfur component. As the sulfur component, there can be used a sulfur powder or sulfur-containing organic compounds. The sulfur component is added to improve photoelectric conversion efficiency. Generally, hydrogen sulfide ($H_2S$) gas is used to add sulfur to the preformed CIGS thin film. Alternatively, a sulfur compound, such as an alkyl thiol (RSH wherein R is alkyl or carboxyalkyl) or thioacetamide is included in the coating slurry to add sulfur component in the final thin film. In this case, the sulfur component may be used in an amount of about 1 to about 100% by weight, based on the weight of the CIGS powder.

The coating slurry may further include a dopant component to improve the efficiency of a solar cell including the final thin film. Examples of such dopant components include metal components, such as Na, K, Ni, P, As, Sb and Bi. These metal components may be used alone or in combination thereof. The dopant component may be any compound capable of generating the corresponding metal ion in a reaction system. The amount of the dopant component used is in the range of about 0.01 to about 10% by weight, based on the weight of the CIGS powder.

The substrate can be any conductive materials capable of withstanding heat treatment temperatures in the subsequent steps. Examples of such conductive materials include indium tin oxide (ITO), fluorine-doped indium tin oxide (FTO), glass, metal foils, metal plates and conductive polymer materials. The substrate also includes a non-conductive substrate layered with a conductive thin-film.

The coating slurry may be applied to the substrate by conventional coating techniques, for example, doctor blade coating, screen coating, spin coating, spray coating and paint coating. The coating thickness may be in the range of 0.5 to 10 μm.

Next, solvents and organic binders of the slurry coat layer is evaporated by heating in an inert or reducing gas atmosphere leaving a dry coat layer. It is then pressed and heat-treated in an inert or reducing gas atmosphere to form a powder coat layer with improved packing density. As shown in FIG. 1, heat treatment of the coating layer in an inert or reducing gas atmosphere to remove solvents and organic binders (S2) and compression of the powder layer (S3) are sequentially performed. However, this order is illustrative only and the heat treatment and the compression may be performed in the reverse order.

Specifically, the slurry coat layer is heat-treated in an inert or reducing gas atmosphere to form a powder coat layer (S2). The heat treatment is performed to evaporate the solvent, and optionally, to remove the dispersant and/or the binder.

The slurry coat layer is heat-treated at 50 to 350° C., preferably 100 to 300° C., more preferably 150 to 250° C., in an inert gas and/or reducing gas atmosphere, for example, in a mixed gas of hydrogen and an inert gas, such as argon or nitrogen.

As a result of the heat treatment, the solvent, and optionally, the organic materials, such as the dispersant and the binder, are removed from the coating slurry to form a CIS or CIGS powder layer. The solvent and the organic materials are insufficiently removed at a heating temperature below the lower limit. Meanwhile, strong bonds are formed between the CIGS particles at a heating temperature exceeding the upper limit as a result of sintering of the particles. This strong bonding impedes migration of the powder particles, making it difficult to improve the packing density of the powder layer in the subsequent compression step.

In step S3, the powder layer is pressed to achieve high packing density.

Figure 2:
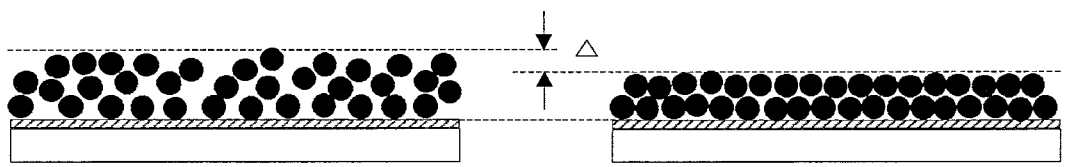
FIG. 2 is a schematic illustration of improvement in the particle packing density of a powder coat layer by additional compression in accordance with a method of the present invention.

In this step, the powder layer is compressed at a pressure of 0.05 to 10 MPa, preferably 0.5 to 5 MPa. As a result of the compression, the powder layer is compressed to 50 to 90% of its original thickness to increase the particle packing density. FIG. 2 is a schematic diagram for explaining an improvement in the packing density of the powder layer through compression. The thickness of powder layer is reduced by "A" by compression.

In the compression step, any means or methods that can reduce the thickness of the powder layer while increasing the packing density of the CIGS particles may be adopted without limitation. For example, the powder layer may be pressed vertically by pressing a planar plate superimposed onto the powder coat layer with a load or by rolling a cylindrical roll over the upper surface of powder coat layer with weight.

The powder layer may be pressurized in a state in which a release sheet is positioned between the planar plate or cylindrical roll and the powder layer to prevent the surface of the planar plate or cylindrical roll from being stained with the CIGS powder. The release sheet may be a paper coated with oil, fat, hydrocarbon resin or silicone, a polymer film or a metal plate.

Next, in step S4, the pressed powder coat layer is heat-treated in an inert gas or reducing atmosphere to form a sintered thin film.

The heat treatment of the pressed powder coat layer is performed at 250 to 600° C., preferably 400 to 550° C. in an inert gas and/or reducing gas atmosphere, for example, in a mixed gas of hydrogen and an inert gas, such as argon.

The heat treatment is to sinter the pressed powder layer into a dense thin film, and when the heating temperature is below the lower limit, open pores penetrating the thin film occur whereas when it exceeds the upper limit, the substrate made of glass or polymer may be thermally deformed or damaged as well as the composition of the CIGS layer can change due to the selenium evaporation.

The thin film formation step (S4) includes the heat treatment in a selenium atmosphere which induces dramatic grain growth. During this step, the vaporized selenium preferentially deposits as liquid between the CIGS particles due to capillary condensation. The selenium liquid activates sintering of the CIGS particles which results crystal grain growth and rapid densification of the powder coat layer.

When the selenization is applied to a selenium-deficient $CuIn_xGa_{1-x}Se_y$ ($0 \le x \le 1$, $y<2$) composition, the deficient selenium is supplied which strengthens inter-particle sintering and results in densification of the powder coat layer. Meanwhile, when the selenization is applied to a stoichiometric $CuIn_xGa_{1-x}Se_2$ ($0 \le x \le 1$) composition, selenium liquid deposited between the particles by capillary condensation forms a small liquid meniscus to provide a strong compressive force between the powder particles. This compressive force induces deformation of the particles and promotes migration of the materials to induce crystal grain growth, leading to liquid-assisted densification.

Figure 3:
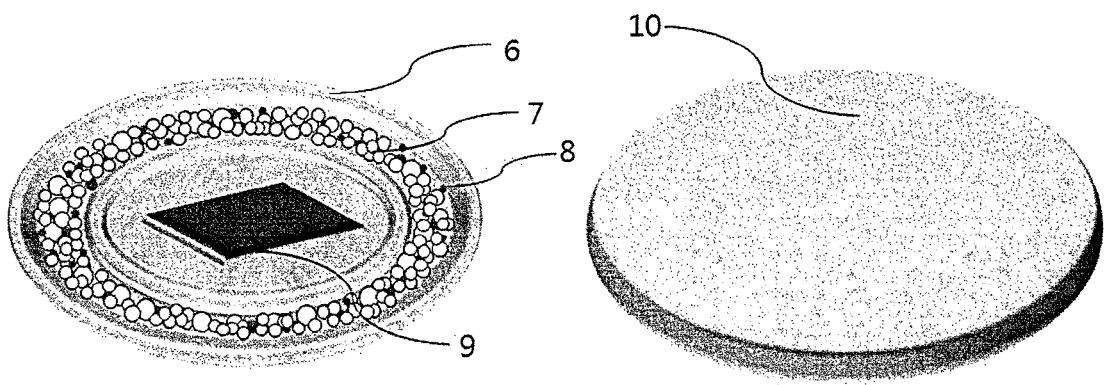
FIG. 3 is a representative illustration of selenization of the powder coat layer with the mixture of selenium and ceramic powders in accordance with an embodiment of the present invention.
Figure 15:
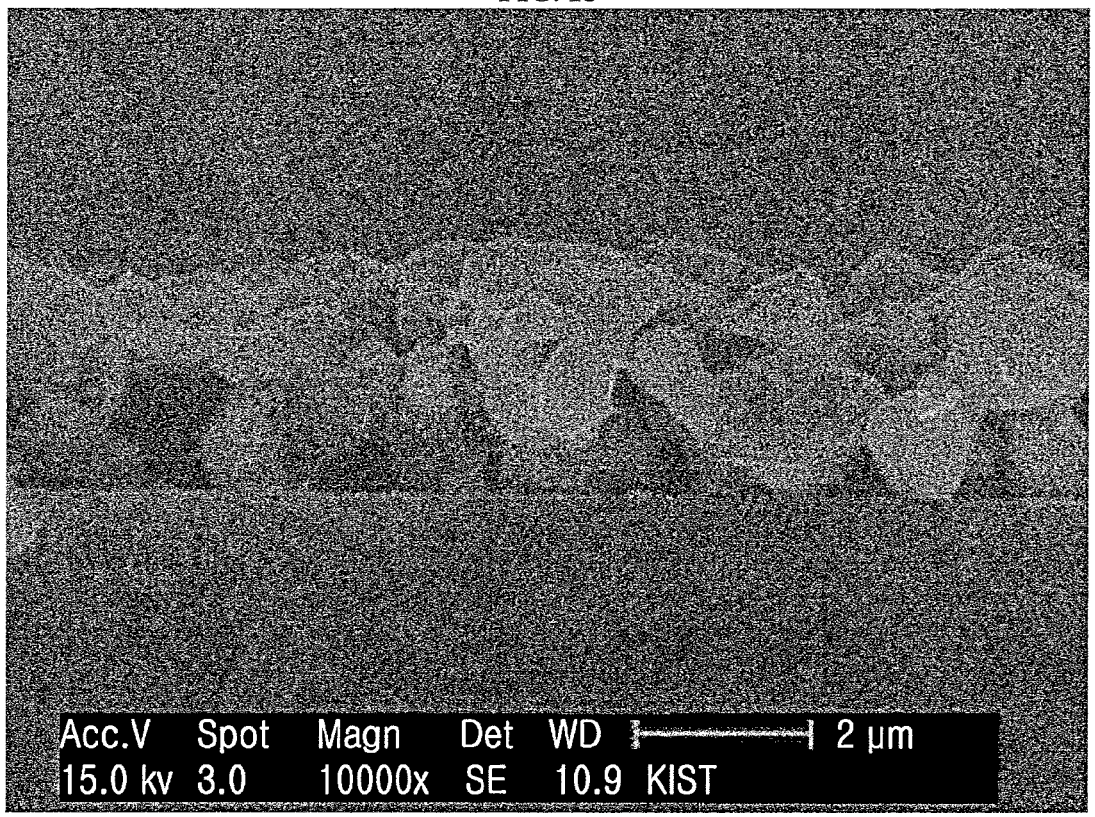
FIG. 15 is a cross-sectional view of SEM image of a thin film prepared in the inert gas atmosphere including selenium vapor directly evaporated from elemental selenium alone in Example 3.
Figure 16:
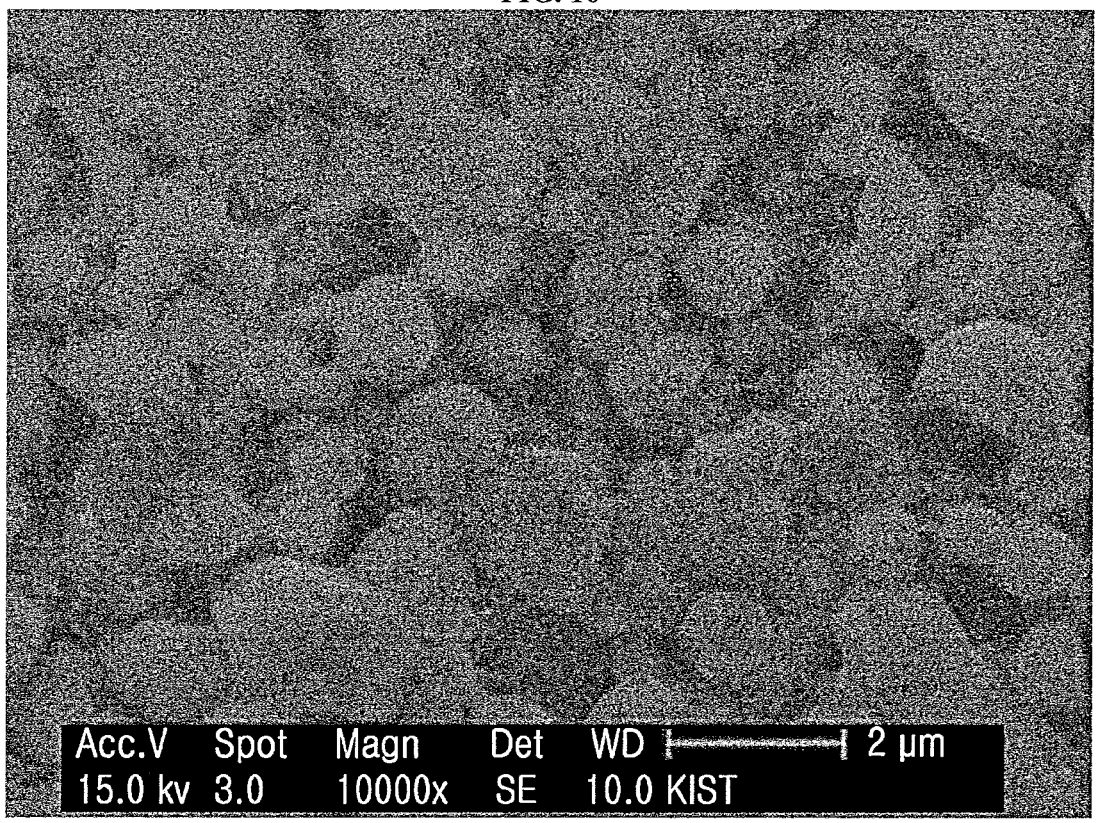
FIG. 16 is a top-view of SEM image of a thin film prepared in the inert gas atmosphere including selenium vapor directly evaporated from in the metallic selenium in Example 3.

In the method of the present invention, the selenization is performed with an elemental selenium powder instead of a toxic gas, such as hydrogen selenide ($H_2Se$) During the selenization, the selenium powder is placed around the substrate where the pressed powder layer is formed, as shown in FIG. 3. The selenium powder is mixed with a ceramic powder to control the evaporation rate of the selenium to allow for a constant supply of the selenium vapor, so that the microstructure of the thin film can be effectively formed. In this step, the elemental selenium powder is included in an amount of 1 to 40% by volume, based on the total volume of the mixed powder. If the selenium powder is included in an amount exceeding the upper limit, the ceramic powder does not impede evaporation of the selenium metal (i.e. reduce the evaporation area), which is analogous to when the selenium powder alone is applied. Further, if the selenium powder is used alone, it is evaporated rapidly in the early stage and a large amount thereof is condensed on the surface of the powder layer before sufficient inter-particle sintering occurs. As a result, the CIGS particles of the powder layer are surrounded by the excess of selenium liquid and become spherical in structure (FIGS. 15 and 16 of Example 3). On the other hand, if the selenium content of the mixed powder is less than the lower limit, it is difficult for the selenium vapor to diffuse and escape through pores between the ceramic powder particles. As a result, a reliable supply of the selenium vapor is impossible and the effect of selenization cannot thus be expected. The mixing ratio of the selenium and ceramic powders can be chosen such that the selenium vapor is supplied in a constant rate without being greatly affected by the time at the designated heating temperature.

FIG. 3 is a schematic illustration of the selenization set-up of the powder coat layer in accordance with an embodiment of the present invention. Referring to FIG. 3, a glass substrate 9, on which the CIGS powder layer with improved packing density is formed, is placed at the center of an alumina crucible 6, and a mixed powder of a ceramic powder 7 and an elemental selenium powder 8 is placed around the glass substrate 9. The glass substrate 9 and the mixed powder are covered with a cover 10 which is subjected to heat treatment.

The CIS or CIGS thin-film light-absorbing layer produced by the method of the present invention is dense enough to substantially prevent the formation of pin holes and therefore, it can enhance the efficiency of a solar cell.

Figure 4:
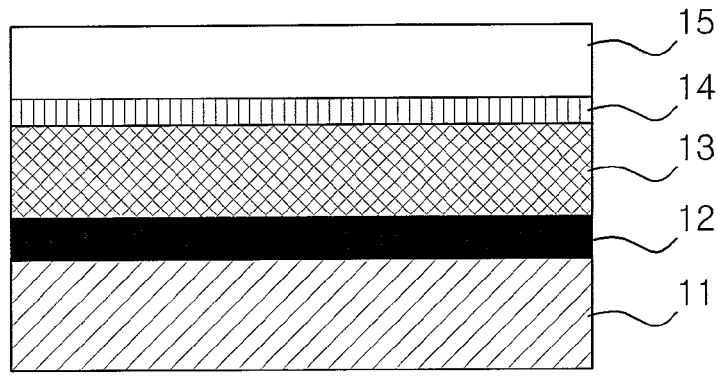
FIG. 4 is a schematic view illustrating the structure of a copper indium selenium (CIS) or copper indium gallium selenium (CIGS) thin-film solar cell according to an embodiment of the present invention.

The CIS or CIGS thin-film solar cell of the present invention includes a substrate 11, a back electrode layer 12, a light-absorbing layer 13, a buffer layer 14 and a transparent electrode 15 laminated in this order as illustrated in FIG. 4.

Specifically, the method for manufacturing the CIS or CIGS thin-film solar cell of the present invention includes forming the back electrode layer 12 on a surface of the substrate 11; applying a powder slurry including a CIS or CIGS powder to the back electrode layer 12 to form a slurry coat layer; forming a powder coat layer by heat treatment in an inert or reducing gas atmosphere to evaporate solvents and organic binders from the slurry coat layer; pressing the powder coat layer to improve its particle packing density; heating the powder coat layer with improved packing density in an inert or reducing gas atmosphere to form the light-absorbing thin film 13; forming the buffer layer 14 on the thin film 13; and forming the transparent electrode layer 15 on the buffer layer 14.

The substrate 11 may be washed with a solvent, such as deionized (DI) water, acetone or ethanol, and dried prior to use.

The back electrode layer 12 may be deposited by sputtering of a metal material, such as molybdenum (Mo), on one surface of the substrate 11. For example, the molybdenum back electrode layer 12 may be formed by applying a sputtering power of about 30 to about 100 Watts to a molybdenum target in an argon gas chamber at about 1 to about 10 mTorr and its thickness may be about 1 µm.

Next, the thin-film light-absorbing layer 13 is formed on the back electrode layer 12 as explained earlier.

Next, the buffer layer 14 is deposited on the thin-film light-absorbing layer 13. The buffer layer 14 may be formed by chemical bath deposition of cadmium sulfide (CdS) on the thin-film light-absorbing layer 13. For example, the buffer layer 14 may be deposited on the thin-film light-absorbing layer 13 by dipping the substrate 11, on which the back electrode layer 12 and the thin-film light-absorbing layer 13 are formed, in a mixed solution of cadmium sulfate ($CdSO_4$), ammonium hydroxide ($NH_4OH$), ammonium chloride ($NH_4Cl$), thiourea ($CS(NH_2)_2$) and deionized water. The mixed solution may be heated to about 70° C. during the deposition and the buffer layer 14 may be as thick as 50 nm on the thin-film light-absorbing layer 13.

Next, the transparent electrode layer 15 is deposited on the buffer layer 14. The transparent electrode layer may consist of a first transparent electrode layer and a second transparent electrode layer. The first transparent electrode layer may be formed by RF sputtering deposition of a metal oxide, such as zinc oxide (ZnO), on the buffer layer 14. The first transparent electrode layer may be deposited to a thickness of about 50 nm on the buffer layer 14. The second transparent electrode layer may be formed on the first transparent electrode layer by RF sputtering deposition of zinc oxide (ZnO) doped with aluminum oxide ($Al_2O_3$) as thick as 500 nm.

The present invention will be explained in more detail with reference to the following examples. These examples are provided to assist the understanding of the invention and are not intended to limit the scope of the invention.

EXAMPLES

Example 1

1) Preparation of CIGS Compound Powder

Figure 5:
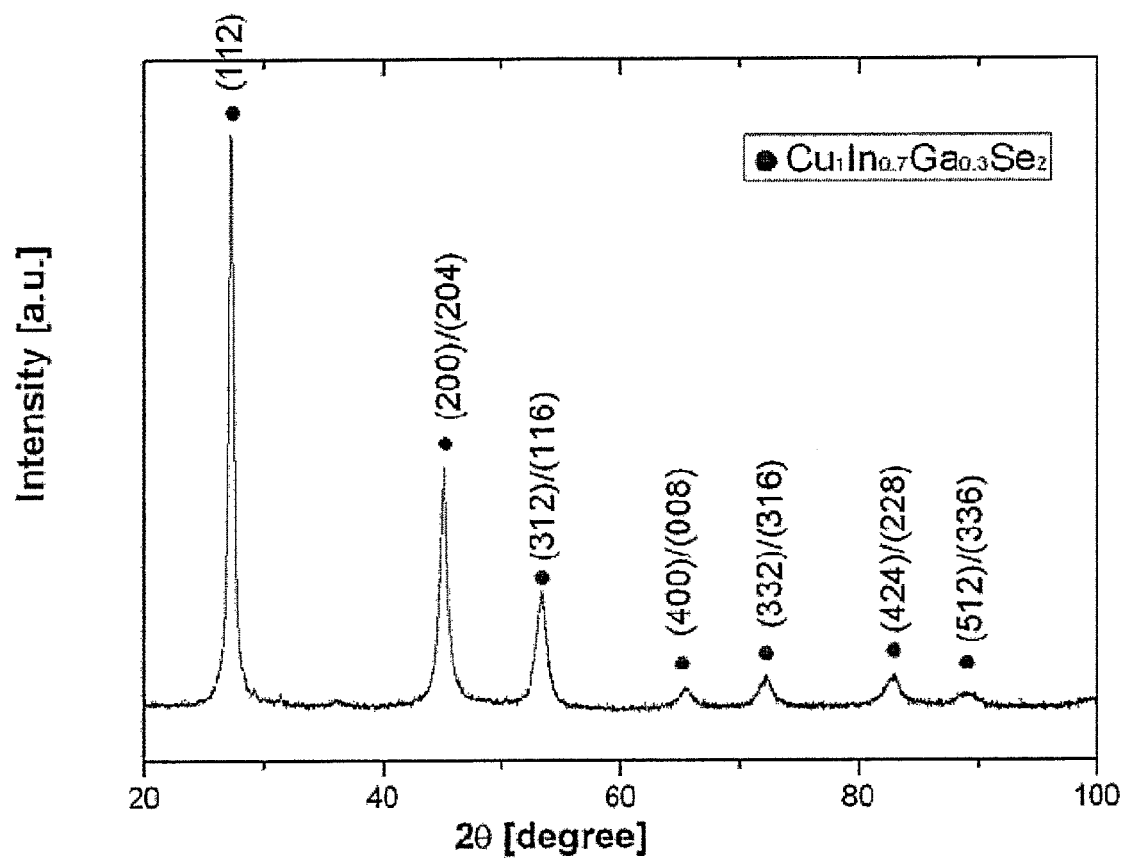
FIG. 5 is a powder X-ray diffraction pattern (Bruker D8 Advance, Cu Ka target (=0.15406 nm)) of a CIGS metal powder prepared in step (1) of Example 1.
Figure 6:
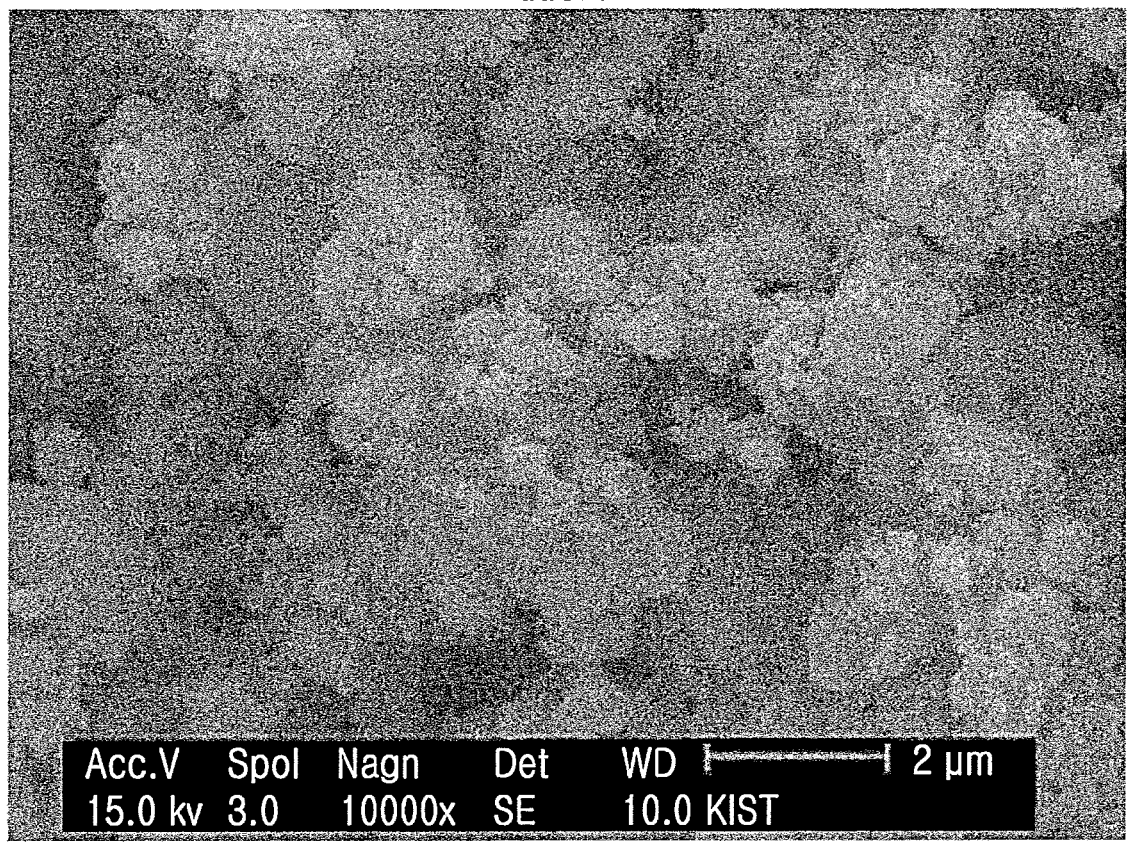
FIG. 6 is a top-view of scanning electron microscopy (SEM) (FEI XL-30 FEG, 15 kV) image of the CIGS metal powder prepared in step (1) of Example 1.

A copper metal powder (Cu purity 99.9%, average diameter 140 µm), an indium metal powder (In purity 99.99%, average diameter 140 µm), a gallium metal powder (Ga purity 99.99%, liquid at room temperature) and a selenium powder (Se purity 99.99%, average diameter 140 µm) as raw materials were mixed to compose $CuIn_xGa_{1-x}Se_y$ (x=0.7, y=2). The mixture was placed in a stainless steel jar filled with zirconia balls and dry milled in a planetary milling machine at 200 rpm for 30 min. X-ray diffraction and scanning electron microscopy (SEM) analysis indicated that the mixture had a single phase of the composition $CuIn_xGa_{1-x}Se_y$ (x=0.7, y=2) and was polydispersed in size having an average diameter of 30 to 850 nm. The diffraction results are shown in FIG. 5 and a SEM image of the mixture is shown in FIG. 6.

2) Preparation of the Powder Slurry

Pentanol (95.5 wt %), ethyl cellulose (3.0 wt %) and a powder dispersant (KD-2) (1.5 wt %) were mixed in a vial and heated to 50° C. with stirring at 200 rpm. To the mixture was then added the CIGS compound in a weight ratio of 5:5. The resulting slurry was milled in a planetary milling machine for 3 hr to prepare a powder slurry in which the CIGS compound powder was homogeneously dispersed.

3) Formation of Slurry Coat Layer and Powder Coat Layer

The powder slurry was deposited to a glass substrate by screen printing to form a slurry coat layer. The substrate covered with the slurry coat layer was heated to 250° C. and maintained at the temperature for 1 hr in a nitrogen gas atmosphere to remove the organic materials from the coating slurry resulting a powder coat layer.

4) Compression of Powder Coat Layer

A paper coated with a hydrocarbon resin was placed on the CIGS powder coat layer such that the coated surface of the paper was in contact with the powder coat layer. The planar plate was superimposed on the powder coat layer and pressed at a pressure of 2.5 MPa to densify the powder coat layer. The cross section of the powder coat layer was observed before and after compression to compare. The thickness of the powder coat layer was reduced by 24% by compression, indicating an increase in particle packing density of the powder coat layer.

5) Formation of Thin Film

Figure 7:
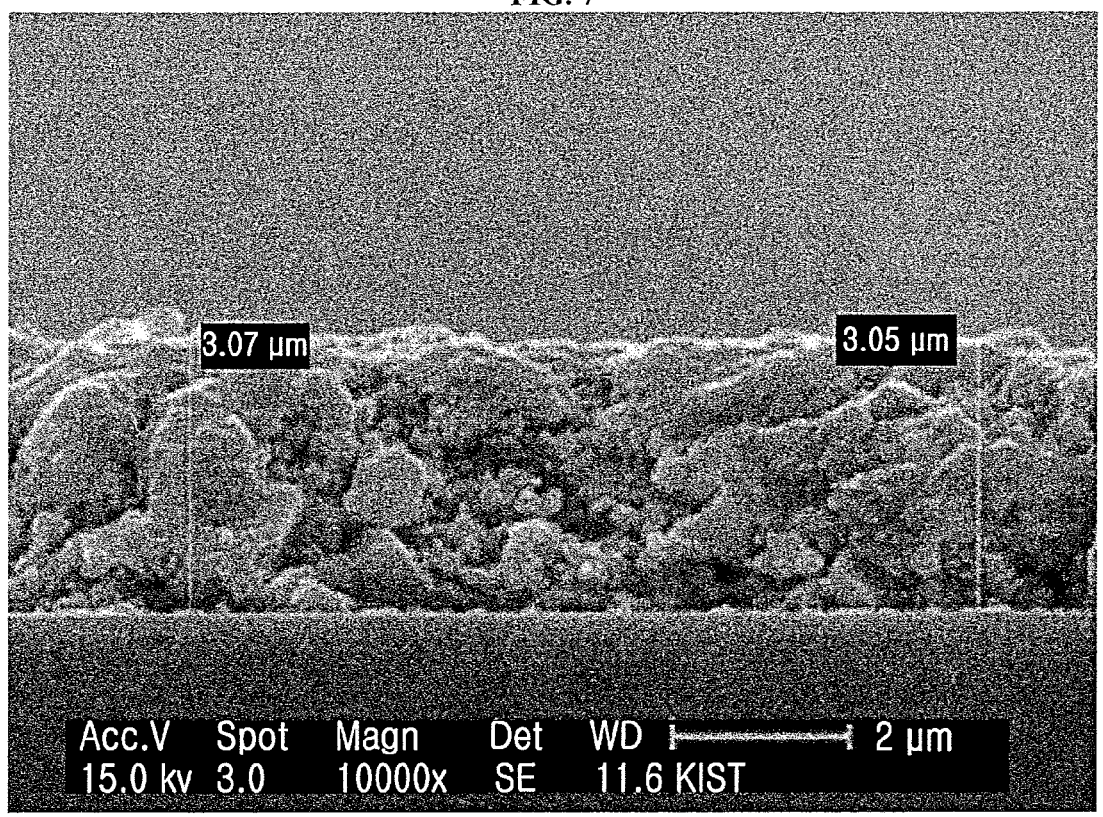
FIG. 7 is a cross-sectional view of SEM image of a thin film produced by sintering of a powder coat layer with improved particle packing density in Example 1.
Figure 8:
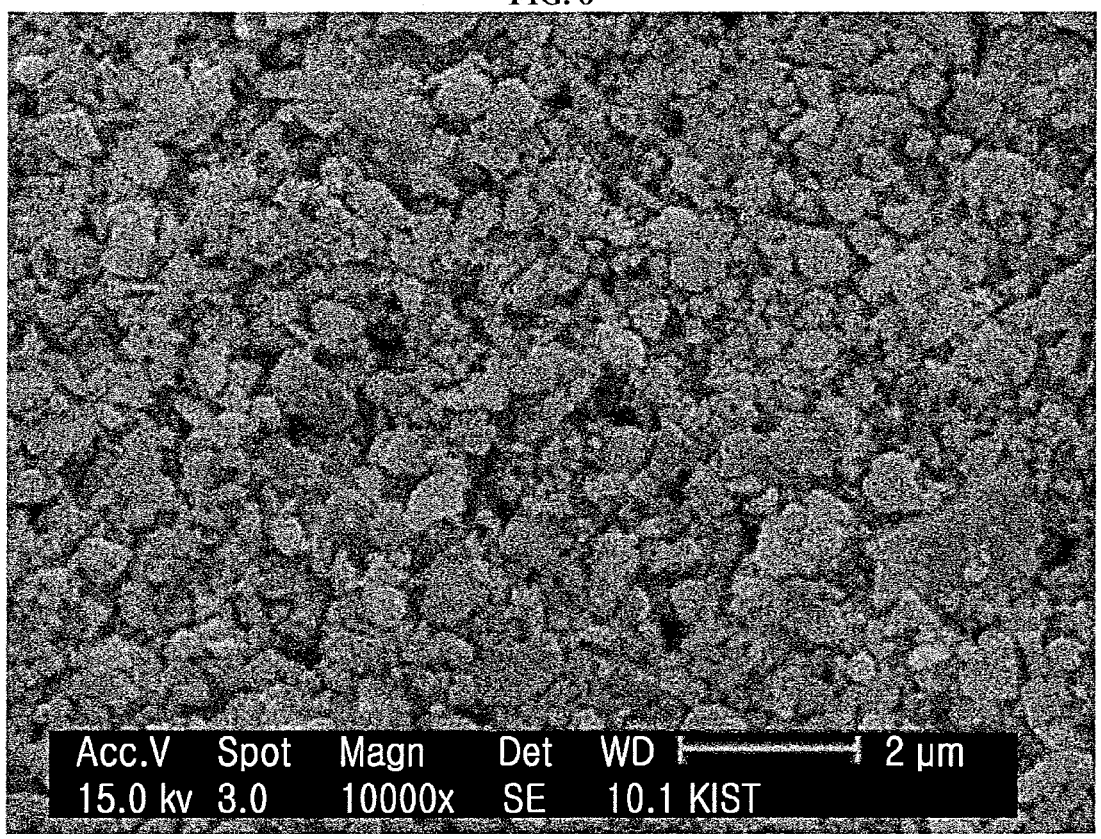
FIG. 8 is a top-view of SEM image of a thin film produced by sintering of a powder coat layer with improved particle packing density in Example 1.

The powder coat layer with improved particle packing density was sintered in a nitrogen gas atmosphere containing 4 vol % of hydrogen at 550° C. for 1 hr. SEM images of the cross section and top-view of the sintered thin film are shown in FIGS. 7 and 8, respectively.

Comparative Example 1

A thin film was produced in the same manner as in Example 1, except that step 4) was omitted. That is, the powder coat layer formed in step 3) was not pressed and was sintered by the same method as step 5). SEM images of the cross section and top-view of the sintered thin film are shown in FIGS. 9 and 10, respectively.

Figure 9:
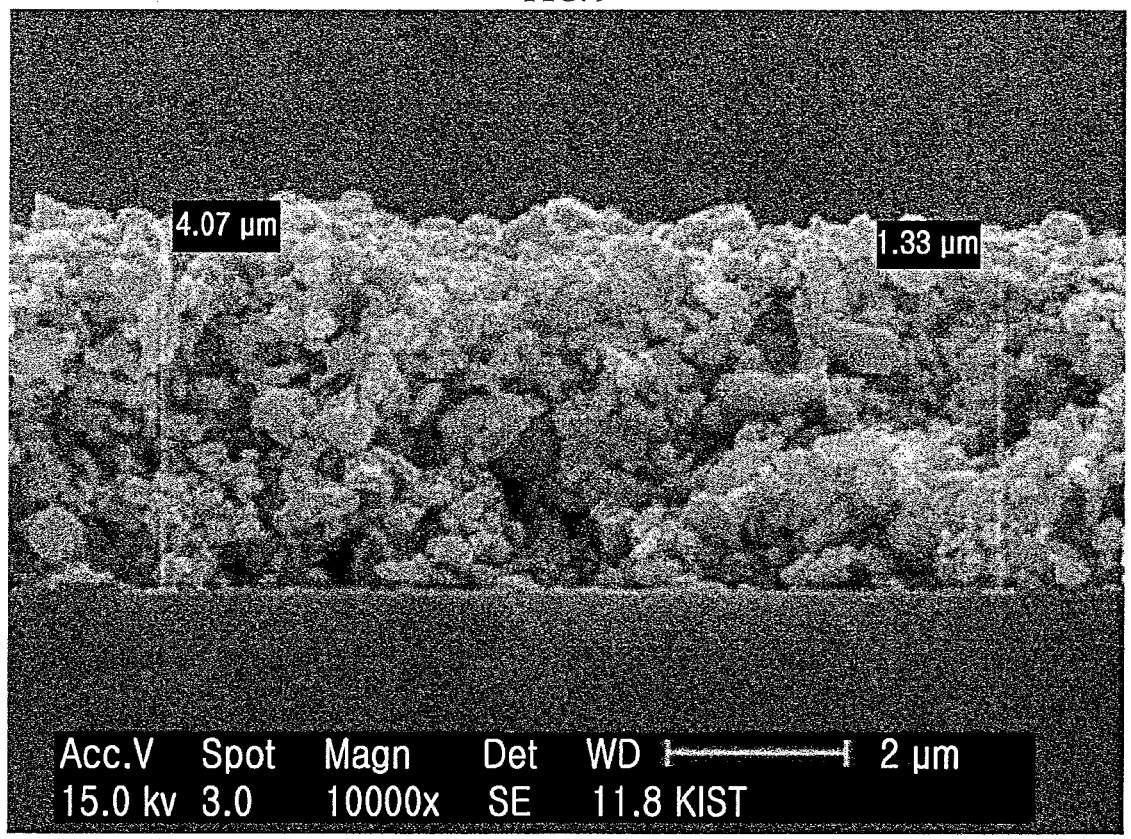
FIG. 9 is a cross-sectional view of SEM image of a thin film produced by sintering of a powder coat layer without additional pressing in Comparative Example 1.
Figure 10:
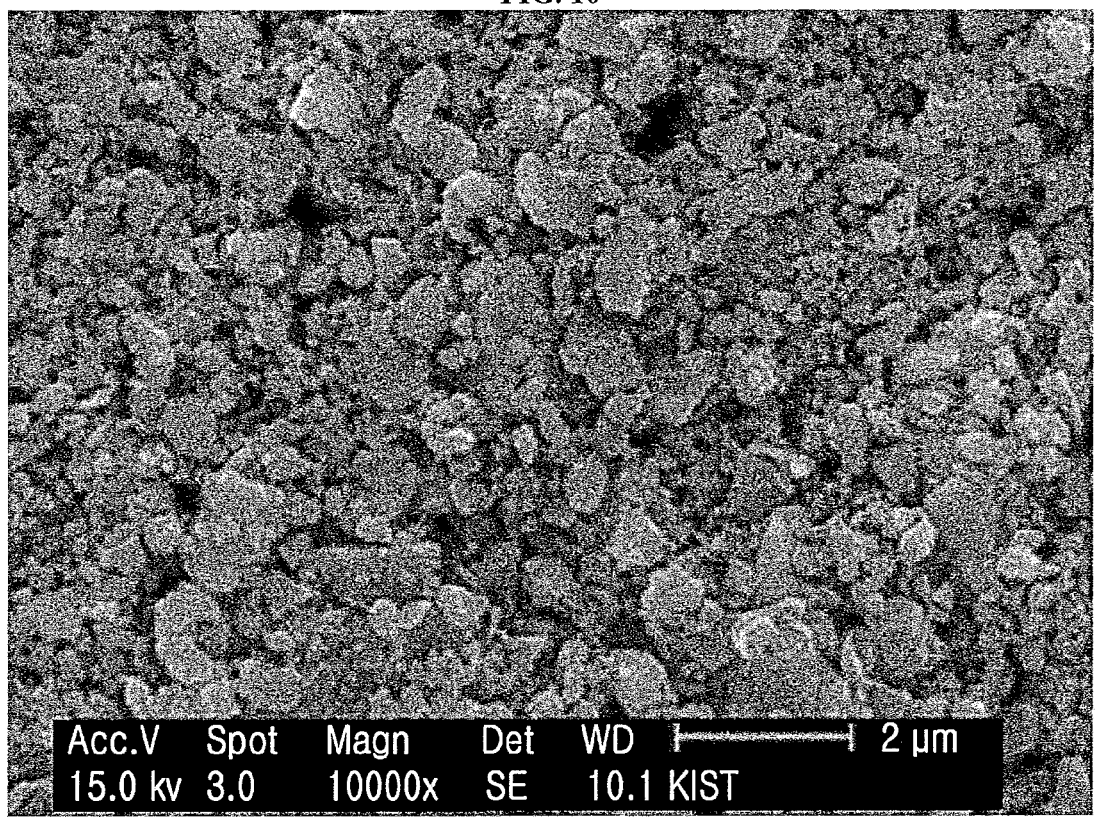
FIG. 10 is a top-view of SEM image of a thin film produced by sintering of a powder coat layer without additional pressing in Comparative Example 1.

The thin film of Comparative Example 1 has 4.01-μm thickness as shown in FIG. 9 and the CIGS particles in the thin film are poorly sintered leaving many pores between the particles. In contrast, thickness of the thin film produced in Example 1 was much reduced (3.05 μm) as a result of the compression of the powder coat layer, indicating that the particle packing density of the thin film was much higher than that of the thin film in Comparative Example 1 (FIG. 7). In addition, the particles of the thin film layer produced in Example 1 were sintered to a considerable extent compared to those of the thin film in Comparative Example 1. Therefore, an increase in crystal grain size and a reduction in the number of pores were observed in the thin film layer produced in Example 1 (FIG. 8).

Example 2

A thin film was produced in the same manner as in Example 1 from step 1) to 4), but step 5) for thin-film formation follows the method explained in Example 2 instead.

The alumina powder ($Al_2O_3$ purity 99.8%, average particle size 75 μm), heat treated at 250° C. for 1 hr, was mixed with a selenium powder (Se purity 99.99%, average diameter 140 μm) in a weight ratio of 4:1. For homogeneous mixing of the selenium and alumina powders, the powder mixture was ball-milled in a 250 ml Nalgene bottle filled with 5-mm zirconia balls at 140 rpm for 2 hr. During the ball milling, the atmosphere was charged with argon to protect the powder mixture from air oxidation. The selenium powder may be in different size after the ball milling.

As illustrated in FIG. 3, the substrate 9, on which the CIGS powder layer with improved packing density is formed, was placed in an alumina crucible 6, and then 0.5 g of the ball-milled powder mixture of alumina 7 and selenium 8 was placed around the substrate 9. The substrate 9 and the powder mixture 7 and 8 were covered with a cover 10, followed by sintering in a nitrogen gas atmosphere containing 4 vol % of hydrogen at 550° C. for 1 hr.

Figure 11:
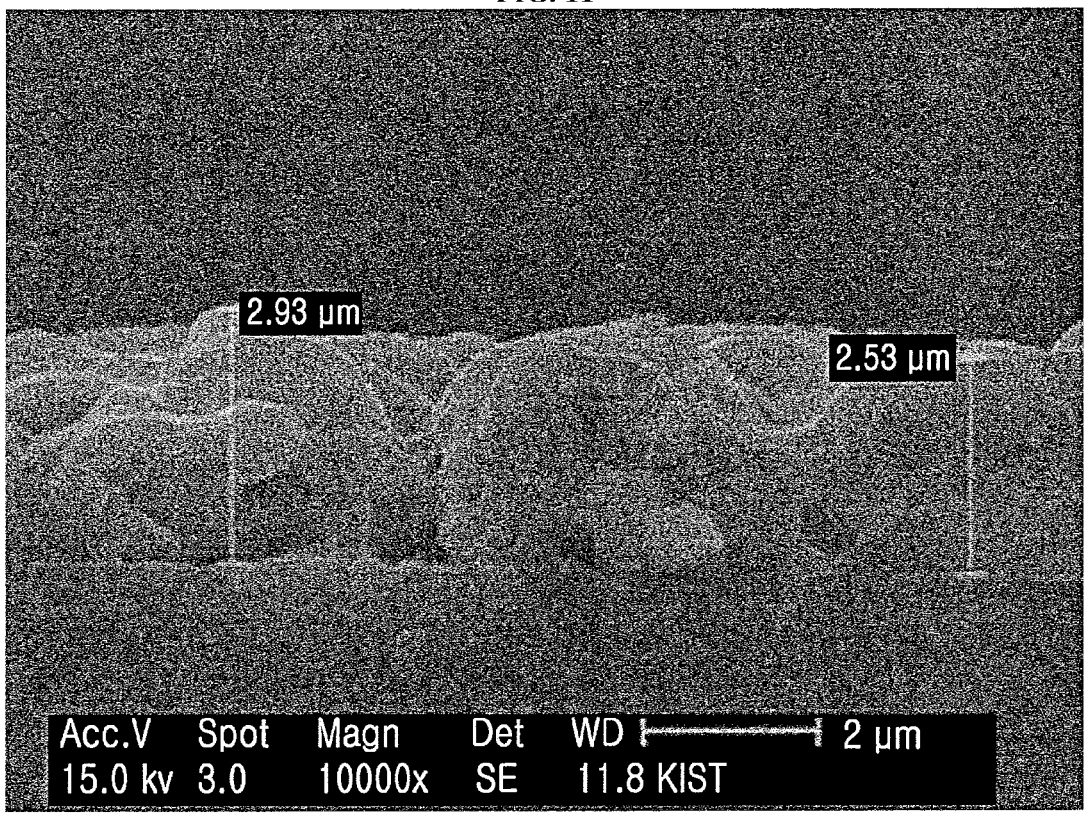
FIG. 11 is a cross-sectional view of SEM image of a thin film prepared in the inert gas atmosphere including selenium vapor in Example 2.
Figure 12:
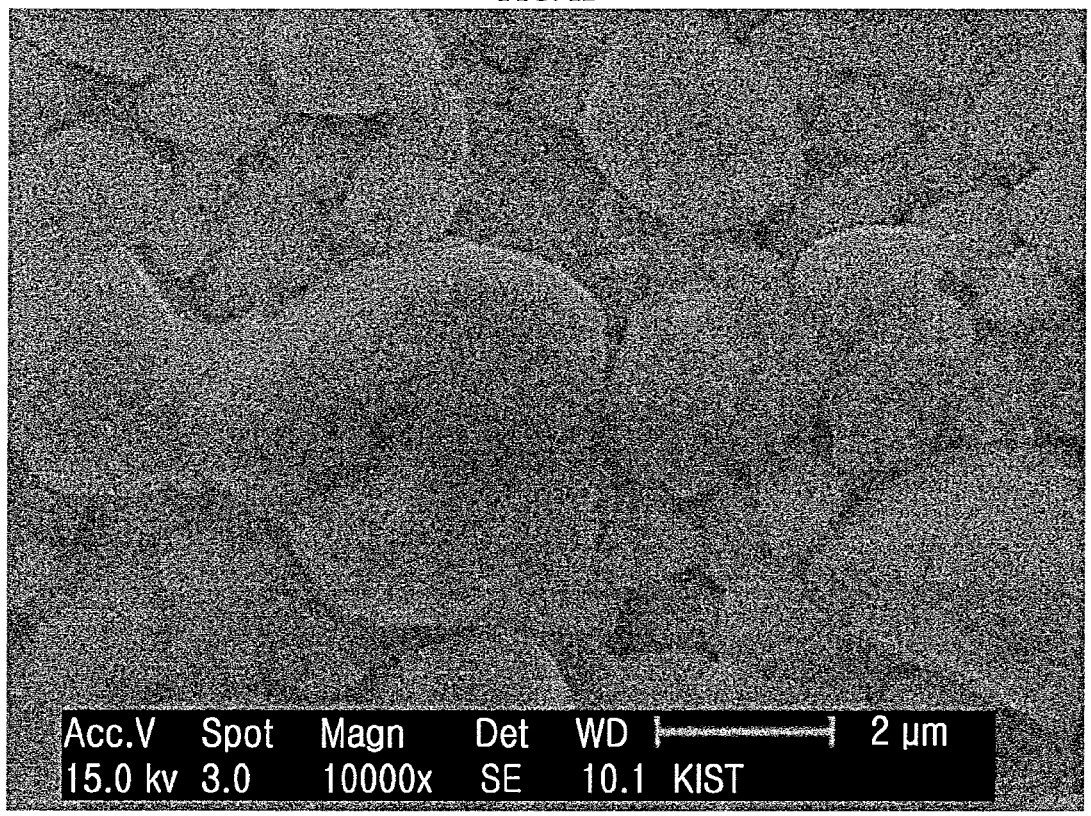
FIG. 12 is a top-view of SEM image of a thin film prepared in the inert gas atmosphere including selenium vapor in Example 2.

The purpose of using the mixed powder (7 and 8) for the selenization process is to control the vapor pressure of the selenium during its evaporation. FIGS. 11 and 12 show cross-sectional and top-view of SEM images of the thin film, respectively. Larger crystal grains and better adhesion to the substrate were observed in the thin film with selenization (FIGS. 11 and 12) than in the thin film without selenization (FIGS. 7 and 8).

Comparative Example 2

Figure 13:
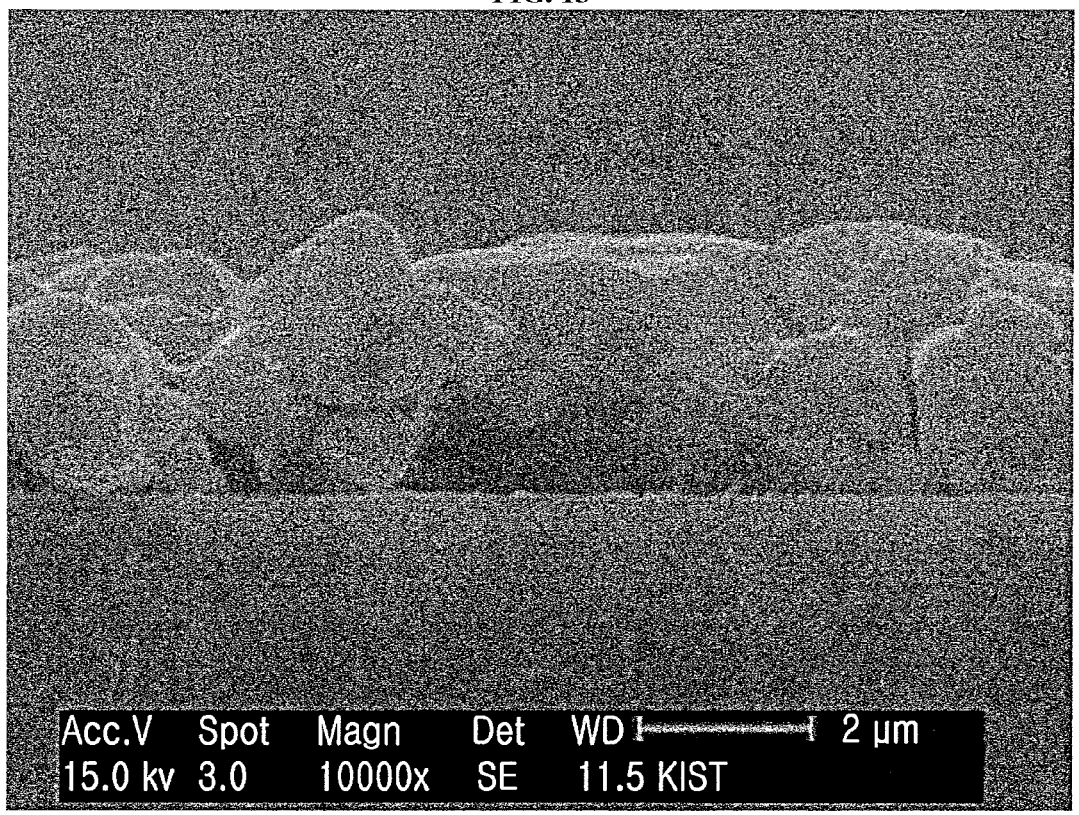
FIG. 13 is a cross-sectional view of SEM image of a thin film prepared in the inert gas atmosphere including selenium vapor without additional compressioning in Comparative Example 2.
Figure 14:
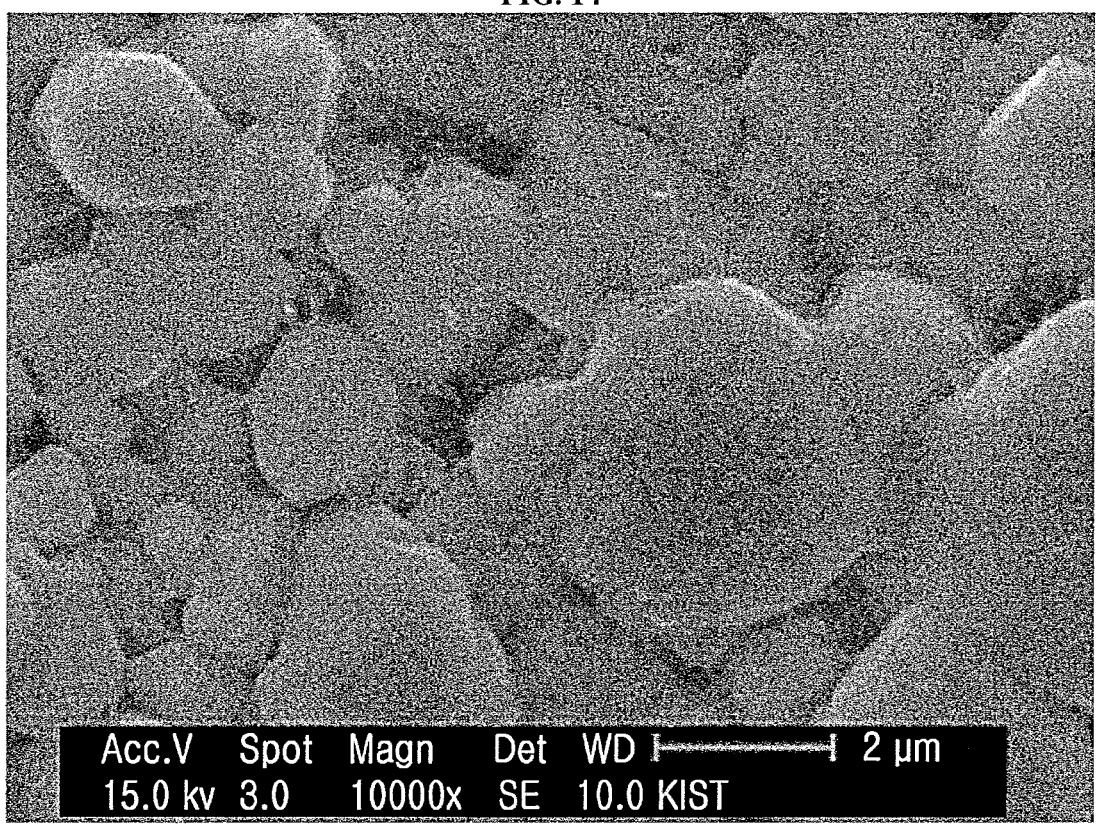
FIG. 14 is a top-view of SEM image of a thin film prepared in the inert gas atmosphere including selenium vapor without additional compressioning in Comparative Example 2.

A thin film was produced in the same manner as in Example 1, except that step 4) was omitted but selenization was applied as in Example 2. FIGS. 13 and 14 are cross-sectional and top-view of SEM images of the resulting thin film, respectively. Although the selenization helped the CIGS particles sinter to an appreciable extent, the particle packing density was low and the film adhesion to the substrate was poor because the powder coat layer was not pressed. It was therefore discernible that the thin film produced in Comparative Example 2 was in poorer quality than the thin film produced in Example 1.

Experimental Example 1

Comparison of Electrical Properties

The electrical properties of the thin film produced by selenization after compression in Example 2 were compared with those of the thin film produced by selenization without compression in Comparative Example 2. The electrical properties of a thin film have a direct influence on the efficiency of a thin-film solar cell. That is, high electron mobility and electrical conductivity of a thin film may lead to high efficiency of a solar cell. The electrical properties of the thin films produced in Example 2 and Comparative Example 2 were measured using a Hall effect measurement system (Ecopia HMS3000) at a magnetic field of 0.57 T by the Van der Pauw method. A 4-point probe method was used to analyze the CIGS thin films deposited on the glass substrates.

TABLE 1

|  | Bulk concentration p ($cm^{-3}$) | Mobility μ ($cm^2/Vs$) | Resistivity p (Ω · cm) | Conductivity σ (1/Ω · cm) |
|---|---|---|---|---|
| (a) Example 2 | $8.6 \times 10^{16}$ | 7.2 | 1.0 | 0.10 |
| (b) Comparative Example 2 | $9.2 \times 10^{16}$ | 0.64 | 106 | 0.0094 |
| (c) Example 1 | $1.4 \times 10^{17}$ | 0.46 | 95 | 0.010 |
| (d) Comparative Example 1 | $1.0 \times 10^{17}$ | 0.32 | 195 | 0.0069 |

The thin film of Comparative Example 2 showed a Hall mobility of 0.64 $cm^2/Vs$ and an electrical conductivity of 0.0094 $(Ω·cm)^{-1}$, whereas the thin film of Example 2 showed a Hall mobility of 7.24 $cm^2/Vs$ and an electrical conductivity of 0.100 $(Ω·cm)^{-1}$, which were about 11-fold higher than those of the thin film of Comparative Example 2. The excellent electrical properties of the thin film of Example 2 are believed to result from improved particle packing density, large crystal grain size and good adhesion to the substrate.

The Hall mobility of the thin film of Example 2 having undergone selenization was about 15-22 times higher than the Hall mobilities of the thin films of Example 1 and Comparative Example 1 having undergone no selenization.

Example 3

To examine the effects of the alumina powder on selenization in Example 2, selenization without the alumina powder was conducted.

As in Example 2, a substrate 9, on which the CIGS powder layer with improved packing density is formed, was placed in an alumina crucible 6 and 0.1 g of a selenium powder alone was placed around the substrate 9. The substrate 9 and the powder were covered with a cover 10, followed by sintering in a nitrogen gas atmosphere containing 4 vol % of hydrogen at 550° C. for 1 hr. Cross-sectional and surface SEM images of the selenized thin film are shown in FIGS. 15 and 16, respectively.

Similarly to Example 2, considerable sintering between the CIGS particles by selenization was occurred but, the resulting crystal grains were as small as about 1 μm in size and were close to spherical in shape. It can be explained as the selenium was evaporated too rapidly at the designated temperature and hence a large amount of selenium liquid was condensed between the CIGS particles. The large amount of selenium limited the grain growth of the CIGS particles since the diffusion between the CIGS particles necessary for the grain growth became hampered. Therefore, it is believed that the mixing of ceramic and selenium powders as in Example 2 will be advantageous in controlling the evaporation rate of the selenium.

Example 4

First, a Mo back electrode 12 was deposited to a thickness of 1,000 nm on a soda lime glass substrate 11 by DC sputtering. The CIGS coat slurry was applied to the back electrode, followed by heat treatment to form a 2 μm thick CIGS thin film 13 in the same manner as in Examples 1-3. A CdS layer 14 was formed to a thickness of 50 nm on the CIGS film by CBD. Subsequently, an i type ZnO transparent electrode was deposited to a thickness of 50 nm on the CdS layer by RF sputtering using a ZnO target. An aluminum doped zinc oxide (AZO) transparent electrode was deposited to a thickness of 500 nm on the ZnO transparent electrode 15 by RF sputtering using an AZO target to manufacture a solar cell having the structure illustrated in FIG. 4. Ni (50 nm) and Al (1 μm) grid electrodes (not shown in FIG. 4) were formed on the cell by thermal evaporation using a grid mask pattern to collect a current on the surface of the cell.

What is claimed is:

1. A method for producing thin-film light-absorbing layer of a copper indium selenium (CIS) or copper indium gallium selenium (CIGS), the method comprising:
   applying a coating slurry comprising a copper indium selenium (CIS) or copper indium gallium selenium (CIGS) powder to a substrate to form a slurry coat layer;
   heating the slurry coat layer in an inert or reducing gas atmosphere to form a powder coat layer, followed by pressing the powder coat layer to increase its particle packing density, or pressing the slurry coat layer to form a powder coat layer, followed by heating the powder coat layer In an inert or reducing gas atmosphere to increase its particle packing density;
   followed by heating the powder coat layer with improved packing density in an inert or reducing gas atmosphere to form a dense thin film,
   wherein the thin film is formed by heat treatment at 250 to 600° C. of the pressed powder coat layer together with a powder mixture of a selenium or sulfur powder and a ceramic powder in a selenium or sulfur atmosphere.

2. The method according to claim 1, wherein the selenium powder is present in the powder mixture by an amount of 1 to 40% by volume, based on the total volume of the mixed powder.

3. The method according to claim 1, wherein each of the powder coat layer and the thin film is formed in a selenium or sulfur atmosphere containing hydrogen gas.

4. A method for manufacturing a thin-film solar cell, the method comprising:
   forming a back electrode layer on one surface of a substrate;
   applying a coating slurry comprising a copper indium selenium (CIS) or copper indium gallium selenium (CIGS) powder to the back electrode layer to form a slurry coat layer;
   heating the slurry coat layer in an inert or reducing gas atmosphere to form a powder coat layer; followed by pressing the powder coat layer to increase its particle packing density; followed by heating the powder coat layer with improved packing density in an inert or reducing gas atmosphere to form a dense thin film;
   forming a buffer layer on the thin film; and
   forming a transparent electrode layer on the buffer layer,
   wherein the thin film is formed by heat treatment at 250 to 600° C. of the pressed powder coat layer together with a powder mixture of a selenium or sulfur powder and a ceramic powder in a selenium or sulfur atmosphere.

5. A method for producing thin-film light-absorbing layer of a copper indium selenium (CIS) or copper indium gallium selenium (CIGS), the method comprising:
   applying a coating slurry comprising a copper indium selenium (CIS) or copper indium gallium selenium (CIGS) powder to a substrate to form a slurry coat layer;
   heating the slurry coat layer in an inert or reducing gas atmosphere to form a powder coat layer; followed by pressing the powder coat layer to increase its particle packing density; followed by heating the powder coat layer with improved packing density in an inert or reducing gas atmosphere to form a dense thin film,
   wherein the coating slurry further include a dopant component in an amount of 0.01 to 10% by weight based on the weight of the CIGS power'
   wherein the thin film is formed by heat treatment at 250 to 600° C. of the pressed powder coat layer together with a powder mixture of a selenium or sulfur powder and a ceramic powder in a selenium or sulfur atmosphere.

6. The method according to claim 1, wherein the copper indium selenium (CIS) or copper indium gallium selenium (CIGS) powder of the coating slurry is selected from: single-phase powders of copper indium gallium selenium sulfur $(CuIn_{1-x}Ga_x(Se_{1-y}S_y)_2$, x, y=0~1); mixtures of copper, indium, gallium, selenium and sulfur; mixtures of oxide powders of copper, indium, gallium, selenium and sulfur; mixtures of binary or ternary compounds of copper, indium, gallium and selenium; mixtures of salts of copper, indium, gallium and selenium; mixtures of organometallic compounds containing copper, indium, gallium, selenium and sulfur; and any combination mentioned above.

7. The method according to claim 1, wherein the coating slurry comprises an aqueous, hydrazine or organic solvent.

8. The method according to claim 1, wherein the coating slurry further comprises at least one binder and/or at least one dispersant.

9. The method according to claim 1, wherein the powder coat layer is formed by heat treatment at 50 to 350° C.

10. The method according to claim 1, wherein the powder coat layer is formed by compression at a pressure of 0.05 to 10 MPa.

11. The method according to claim 1, wherein the powder coat layer is reduced to 50 to 90% of its original thickness by compression to increase the particle packing density.

12. The method according to claim 1, wherein the powder coat layer is pressed by superimposing a planar plate onto and applying a load to or by rolling a cylindrical roll over its upper surface.

13. The method according to claim 12, wherein the powder layer is pressed in a state in which a release sheet is inserted between the planar plate or cylindrical roll and the powder coat layer.

* * * * *